United States Patent
Son et al.

(10) Patent No.: US 9,070,465 B2
(45) Date of Patent: Jun. 30, 2015

(54) ANTI-FUSE CIRCUIT USING MTJ BREAKDOWN AND SEMICONDUCTOR DEVICE INCLUDING SAME

(75) Inventors: Jong-Pil Son, Seongnam-si (KR); Chul-Woo Park, Yongin-si (KR); Hong-Sun Hwang, Suwon-si (KR); Hyun-Ho Choi, Suwon-si (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 414 days.

(21) Appl. No.: 13/586,973

(22) Filed: Aug. 16, 2012

(65) Prior Publication Data
US 2013/0051133 A1  Feb. 28, 2013

(30) Foreign Application Priority Data
Aug. 23, 2011  (KR) .................. 10-2011-0084220

(51) Int. Cl.
  *G11C 11/00* (2006.01)
  *G11C 11/16* (2006.01)
(52) U.S. Cl.
  CPC .......... G11C 11/161 (2013.01); G11C 11/1673 (2013.01)
(58) Field of Classification Search
  USPC ......... 365/48, 55, 62, 66, 74, 78, 80–93, 100, 365/130, 131, 148, 158, 171–173, 209, 213, 365/225.5, 230.07, 232, 243.5; 257/295, 257/421, E21.665; 438/3; 977/933–935
  See application file for complete search history.

(56) References Cited

U.S. PATENT DOCUMENTS

| | | | |
|---|---|---|---|
| 4,499,557 A * | 2/1985 | Holmberg et al. | 365/163 |
| 6,671,213 B2 | 12/2003 | Ohtani | |
| 6,801,471 B2 | 10/2004 | Viehmann et al. | |
| 7,095,649 B2 | 8/2006 | Shimizu et al. | |
| 7,177,181 B1 * | 2/2007 | Scheuerlein | 365/175 |
| 7,466,618 B2 * | 12/2008 | Porter et al. | 365/225.7 |
| 7,859,884 B2 * | 12/2010 | Scheuerlein | 365/148 |
| 2003/0179601 A1 * | 9/2003 | Seyyedy et al. | 365/158 |
| 2004/0240255 A1 * | 12/2004 | Smith et al. | 365/158 |

FOREIGN PATENT DOCUMENTS

| | | |
|---|---|---|
| JP | 2003208796 A | 7/2003 |
| JP | 2005518628 A | 6/2005 |
| JP | 2005276276 | 10/2005 |
| KR | 100501126 | 7/2005 |
| KR | 100613535 | 8/2006 |

* cited by examiner

*Primary Examiner* — Harry W Byrne
(74) *Attorney, Agent, or Firm* — Volentine & Whitt, PLLC

(57) ABSTRACT

An anti-fuse circuit includes an array of anti-fuses. Each anti-fuse has a tunneling magneto-resistance (TMR) element series connected with a transistor, such that breakdown of a magnetic tunnel junction (MTJ) in response to an applied first voltage stores fuse information. A sensing circuit senses and amplifies respective output signals provided by the anti-fuses.

8 Claims, 10 Drawing Sheets

US 9,070,465 B2

ANTI-FUSE CIRCUIT USING MTJ BREAKDOWN AND SEMICONDUCTOR DEVICE INCLUDING SAME

CROSS-REFERENCE TO RELATED APPLICATION

This application claims priority under 35 U.S.C. §119 to Korean Patent Application No. 10-2011-0084220 filed on Aug. 23, 2011, the subject matter of which is hereby incorporated by reference.

BACKGROUND OF THE INVENTION

Embodiments of the inventive concept relate to various semiconductor devices, and more particularly, to semiconductor devices including an anti-fuse circuit that operates in accordance with a magnetic tunnel junction (MTJ) breakdown.

Fuses and/or anti-fuses are used in many different types of semiconductor devices, particularly semiconductor memory devices. The fuse is an element that is turned OFF when one or more condition(s) is satisfied. In contrast, the anti-fuse is an element that is turned ON when one or more condition(s) is satisfied. Among a great variety of other uses, the fuse and/or anti-fuse may be used to select an operating mode for a semiconductor device, conditionally enable a circuit, such as a redundancy array when a defective memory cell is identified in a constituent memory cell array.

In recent years, research has been conducted into a technique of using a portion of a magnetic random access memory (MRAM) cell array as a fuse circuit. However, with increasing integration density of memory cells within semiconductor memory devices, MRAM cells have been downscaled, and the corresponding volume of tunneling magneto-resistive (TMR) elements included in MRAM cells has been is decreased accordingly. Indeed, in certain circumstances, some MRAMs will lose their non-volatile data retention characteristic. Recognizing this possibility, the conventional use of contemporary MRAMs as fuses or anti-fuses is not recommended. Rather, in view of the performance characteristics of the downscaled MRAM cells, new approaches must be considered in the use of a MRAM cell as a fuse or anti-fuse.

SUMMARY OF THE INVENTION

Certain embodiments of the inventive concept provide a viable anti-fuse circuit using the breakdown of a magnetic tunnel junction (MTJ) in a downscaled magnetic random access memory (MRAM) cell despite its volatile characteristics.

Other embodiments of the inventive concept provide a semiconductor memory device including the anti-fuse circuit.

In one embodiment, the inventive concept provides an anti-fuse circuit comprising; an array of anti-fuses, each anti-fuse comprising a tunneling magneto-resistance (TMR) element series connected with a transistor and configured to breakdown a magnetic tunnel junction (MTJ) of the TMR element in response to an applied first voltage, such that alternately provided normal resistance and breakdown resistance for the TMR define an output signal for the anti-fuse that indicates fuse information stored by the anti-fuse, and a sensing circuit configured to sense and amplify the respective output signals provided by the anti-fuses.

In another embodiment, the inventive concept provides an anti-fuse circuit comprising; an array of anti-fuses arranged in a matrix formed by a plurality of bit lines and an intersecting plurality of word lines, wherein each anti-fuse comprises a tunneling magneto-resistance (TMR) element series connected with a transistor between a bit line and a source line, the TMR providing a magnetic tunnel junction (MTJ) subject to breakdown in response to a first voltage applied via the bit line, such that alternately provided normal resistance and breakdown resistance for the TMR define an output signal for the anti-fuse that indicates fuse information stored by the anti-fuse, and a sensing circuit configured to sense and amplify the output signals provided by the array of anti-fuses via the plurality of bits lines.

In another embodiment, the inventive concept provides a semiconductor memory device, comprising; a memory cell array including a normal memory cell array connected to word lines and column selection lines, and a redundancy memory cell array connected to redundant word lines and redundant column selection lines, a column decoder configured to decode column address signals, generate column selection signals, and transmit the column selection signals to the column selection lines, and a redundant column decoder configured to decode the column address signals, generate redundant column selection signals, and transmit the redundant column selection signals to the redundant column selection lines when a defective memory cell is detected in relation to at least one of the column selection lines, wherein the redundant column decoder comprises an anti-fuse circuit including a plurality of tunneling magneto-resistance (TMR) elements, each being respectively connected in series to one of a plurality of transistors, the anti-fuse circuit being configured to breakdown a magnetic tunnel junction (MTJ) for at least one TMR element to store fuse information.

BRIEF DESCRIPTION OF THE DRAWINGS

The foregoing and other features and advantages of the inventive concept will be apparent from a more particular description of certain embodiments, as illustrated in the accompanying drawings. In the drawings.

DETAILED DESCRIPTION

Figure 1:
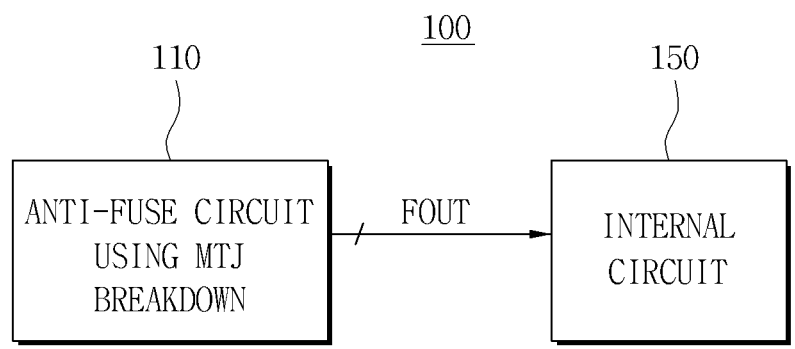
FIG. 1 is a general block diagram of a semiconductor device including an anti-fuse circuit according to embodiments of the inventive concept.

Embodiments of the inventive concept will now be described in conjunction with the accompanying drawings. However, the inventive concept may be variously embodied and should not be construed as being limited to only the illustrated embodiments. Throughout the written description and drawings, like reference numbers and labels are used to denote like or similar elements, components, and features.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

It will be understood that when an element or layer is referred to as being "on", "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the inventive concept may be performed otherwise. That is, the respective steps may be performed in a specified order, substantially at the same time, or in reverse order.

FIG. 1 is a general block diagram of a semiconductor device 100 including an anti-fuse circuit according to embodiments of the inventive concept. Referring to FIG. 1, the semiconductor device 100 comprises an anti-fuse circuit 110 and an internal circuit 150.

The anti-fuse circuit 110 may breakdown one or more magnetic tunnel junctions (MTJs) of TMR elements in order to store fuse information. In relation to the stored fuse information, the anti-fuse circuit 110 may perform an anti-fuse operation by, for example, generating an anti-fuse output voltage FOUT. The internal circuit 150 may perform a specific operation or assume a particular operating state in response to the anti-fuse output voltage FOUT. In one illustrative example, the semiconductor device 100 may be placed into an operating mode that enable a redundancy memory cell array following the identification of one or more defective memory cell(s) in a memory cell array in response to the anti-fuse output voltage FOUT.

Figure 2:
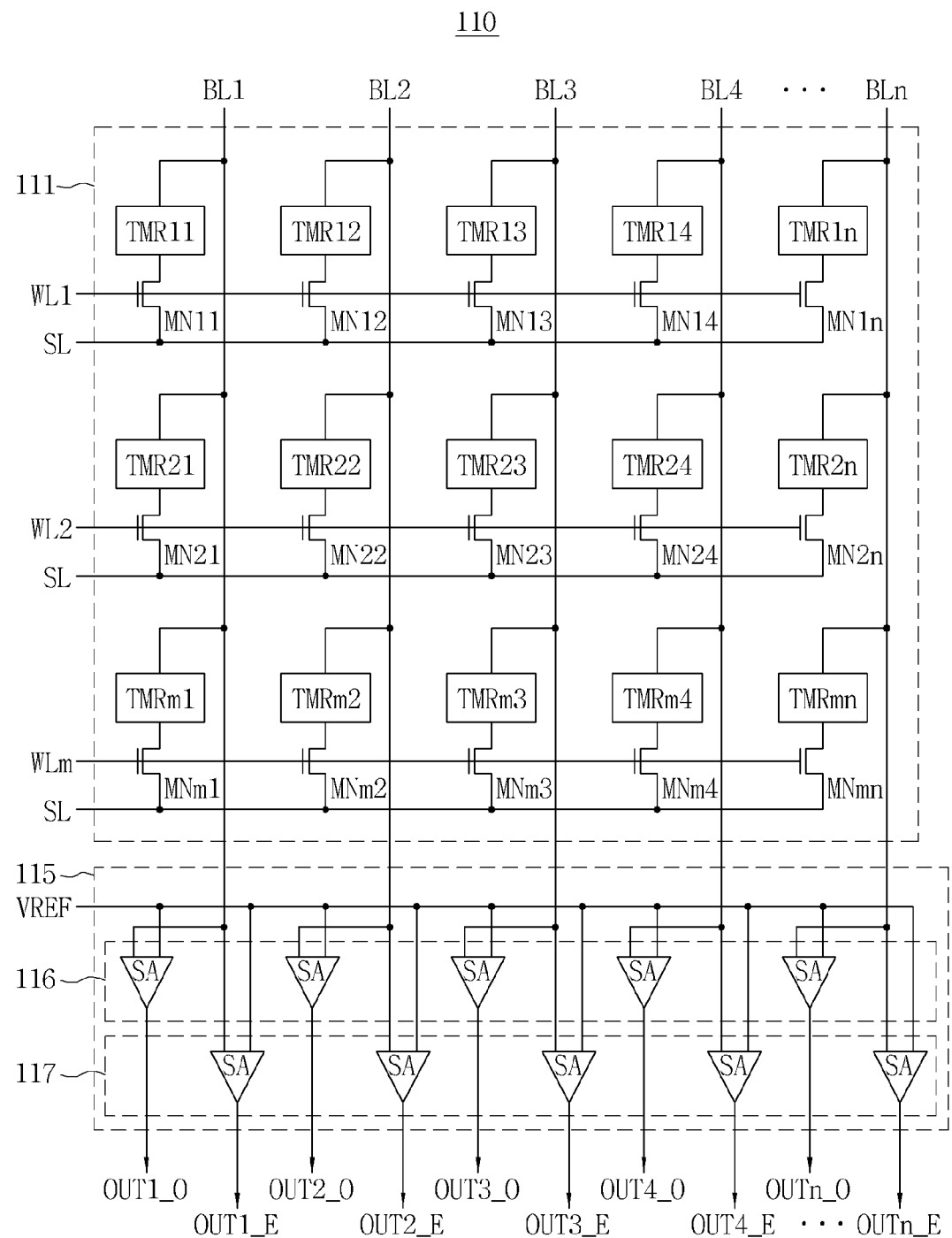
FIG. 2 is a circuit diagram further illustrating the anti-fuse circuit of FIG. 1.

FIG. 2 is a circuit diagram further illustrating the anti-fuse circuit 110 of FIG. 1. Referring to FIG. 2, an anti-fuse circuit 110 comprises an anti-fuse array 111 and a sensing circuit 115.

In the illustrated example, the anti-fuse array 111 includes a plurality of TMR elements TMR11 to TMR1$n$, TMR21 to TMR2$n$, ..., and TMRm1 to TMRmn, and NMOS transistors MN11 to MN1$n$, MN21 to MN2$n$, ..., and MNm1 to MNmn respectively connected in series with the TMR elements TMR11 to TMR1$n$, TMR21 to TMR2$n$, ..., and TMRm1 to TMRmn. The anti-fuse circuit 110 may selectively breakdown the MTJ(s) of at least one of the TMR elements TMR11 to TMR1$n$, TMR21 to TMR2$n$, ..., and TMRm1 to TMRmn to store fuse information. The sensing circuit 115 may then sense and amplify output signals provided by the anti-fuse array 111.

As previously noted, the MRAM cells forming the anti-fuse array 111 include the TMR elements and NMOS transistors and are generally small in size, but volatile in operating characteristics.

In the illustrated example of FIG. 2, each of the TMR elements TMR11 to TMR1$n$, TMR21 to TMR2$n$, ..., and TMRm1 to TMRmn includes a first terminal connected to a corresponding one of a plurality of bit lines BL1 to BLn, and each of the NMOS transistors MN11 to MN1$n$, MN21 to MN2$n$, ..., and MNm1 to MNmn includes a drain connected to a second terminal of a corresponding one of the TMR elements TMR11 to TMR1$n$, TMR21 to TMR2$n$, ..., and TMRm1 to TMRmn, a gate connected to a corresponding one of a plurality of word lines WL1 to WLm, and a source connected to a source line SL.

The sensing circuit 115 comprises an odd sensing circuit 116 and an even sensing circuit 117. The odd sensing circuit 116 amplifies a difference between a voltage of each of the bit lines BL1 to BLn and a reference voltage VREF when odd word lines are enabled to generate odd output signals OUT1_O to OUTn_O. The even sensing circuit 117 amplifies a difference between a voltage of each of the bit lines BL1 to BLn when even word lines are enabled to generate even output signals OUT1_E to OUTn_E.

Figure 3:
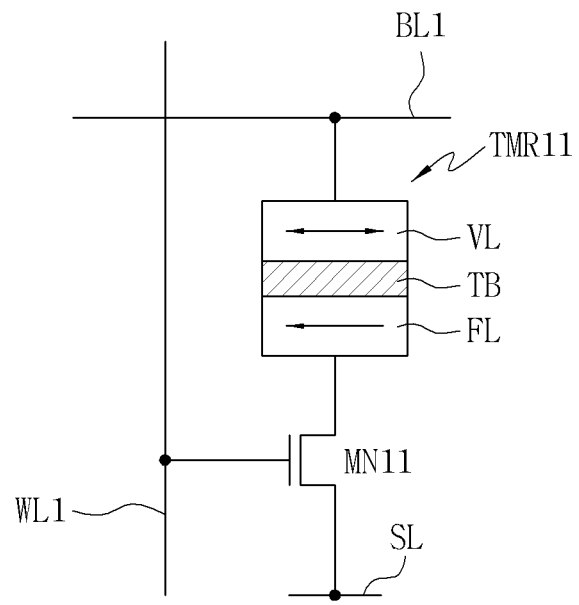
FIG. 3 is a circuit diagram illustrating a magnetic random access memory (MRAM) cell including a tunneling magneto-resistive (MTJ) element.

FIG. 3 is a circuit diagram further illustrating an exemplary MRAM cell including a TMR element.

Referring to FIG. 3, the MRAM cell comprises a TMR element TMR11 and an NMOS transistor MN11. The TMR element TMR11 includes a first terminal connected to a bit line BL1, and the NMOS transistor MN11 includes a drain connected to a second terminal of the TMR element TMR11, a gate connected to a word line WL1, and a source connected to the source line SL.

The TMR element 11 comprises a fixed magnetic layer FL having a predetermined fixed magnetic direction, a variable magnetic layer VL that is magnetized in the direction of an externally applied magnetic field, and a tunnel barrier layer TB formed of an insulating film and disposed between the fixed magnetic layer FL and the variable magnetic layer VL.

Figure 4:
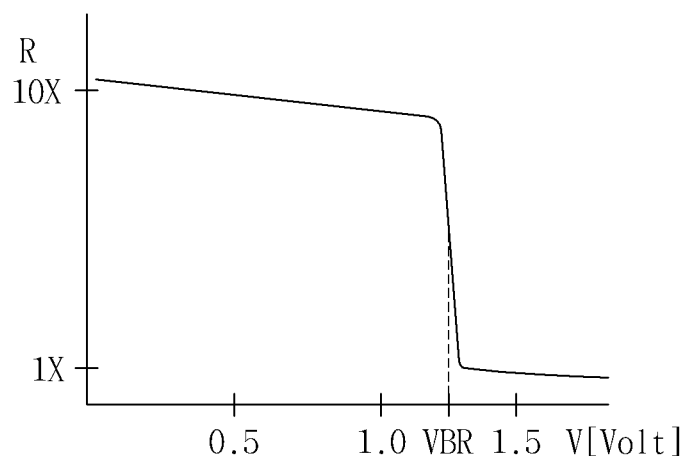
FIG. 4 is a graph showing resistance variation when a breakdown occurs in an MTJ in the TMR element of the MRAM of FIG. 3.

FIG. 4 is a graph illustrating a resistance variation in the MJT of the TMR shown in FIG. 3 before and after breakdown of the MJT. This breakdown occurs in the MTJ at a breakdown voltage VBR. Upon breakdown in the MTJ, the "breakdown resistance" exhibited by the TMR is only about 10% of the pre-breakdown or "normal resistance" of the TMR.

In the anti-fuse circuit 110 of FIG. 2, a first voltage may be applied to a bit line connected to a memory cell to be programmed, out of the bit lines BL1 to BLn, a second voltage may be applied to a word line connected to the memory cell to be programmed, out of the word lines WL1 to WLn, and a low power supply voltage may be applied to the source line SL. Here, the low power supply voltage may be a ground voltage. The first voltage may have a voltage level that causes breakdown of the MJT of the TMR element included in the MRAM cell being programmed, while the second voltage may have a voltage level that turns ON the NMOS transistor included in the memory cell to be programmed. For example, the first voltage may range between 1V and 2V (e.g., 1.2V) while the second voltage may be in the range of about 0.6V. Those skilled in the art will recognize that these specific operating voltage ranges are merely exemplary and will vary will the constituent nature of the MRAM cell. Therefore, an ON-state and OFF-state for the anti-fuse circuit 110 may be determined in accordance with whether or not a breakdown occurs in the tunnel barrier layer TB of the MRAM cell.

Figure 5:
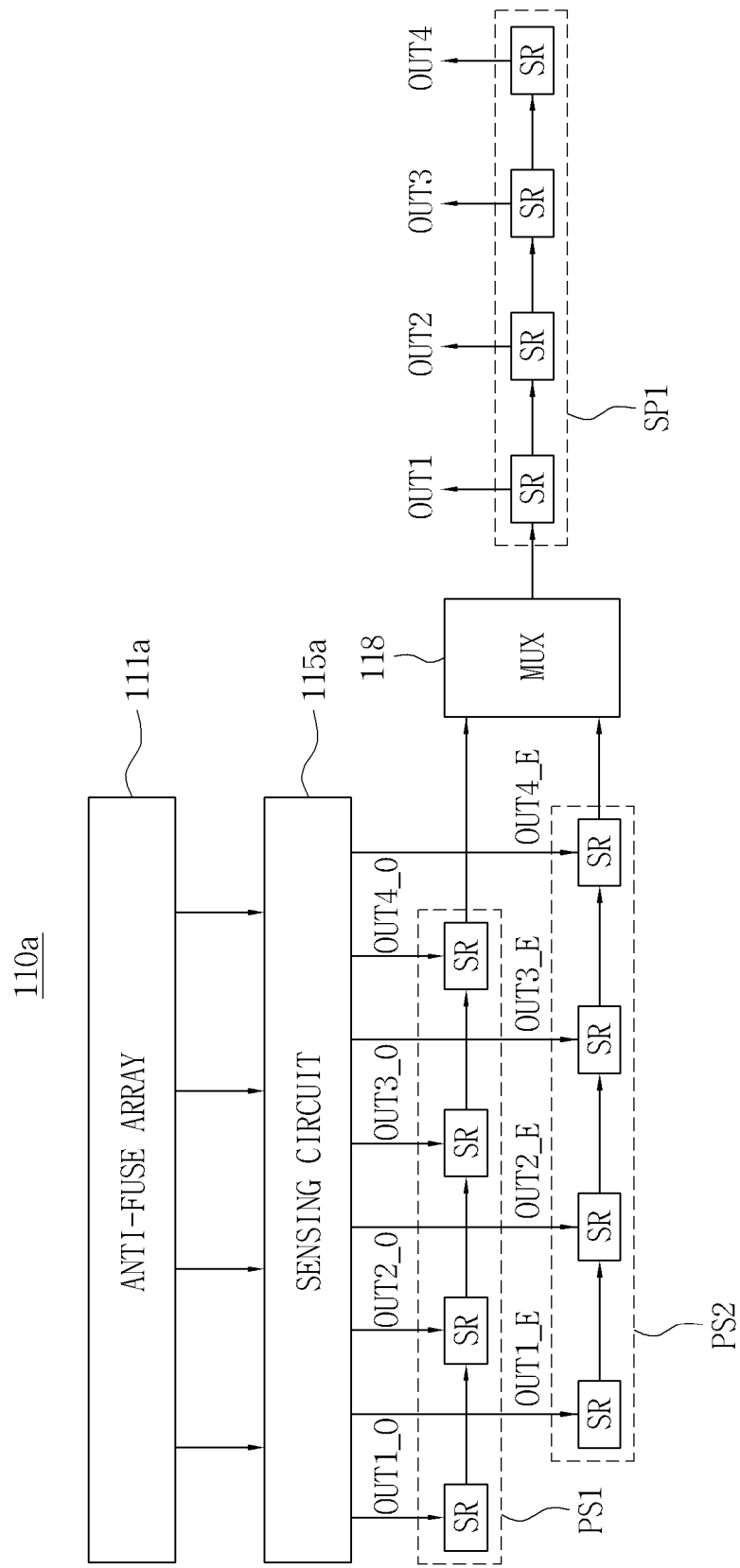
FIG. 5 is a circuit diagram illustrating another example of an anti-fuse circuit using breakdown of an MTJ according to embodiments of the inventive concept.

FIG. 5 is a circuit diagram illustrating another example of a anti-fuse circuit 110a using breakdown of an MTJ according to embodiments of the inventive concept.

Referring to FIG. 5, an anti-fuse circuit 110a comprises an anti-fuse array 111a, a sensing circuit 115a, a first parallel/serial converter PS1, a second parallel/serial converter PS2, and a selection circuit 118.

The first parallel/serial converter PS1 is configured to convert output signals OUT1_O, OUT2_O, OUT3_O, and OUT4_O received from the odd sensing circuits, and the second parallel/serial converter PS2 is configured to convert the output signals OUT1_E, OUT2_E, OUT3_E, and OUT4_E received from the even sensing circuits. The sensing circuit 115a may be substantially similar to the sensing circuit 115 of FIG. 2, or may be modified to incorporate the first parallel/serial converter PS1, second parallel/serial converter PS2, and/or selection circuit 118.

The selection circuit 118 may be configured to select one of the output signals OUT1_O, OUT2_O, OUT3_O, and OUT4_O provided by the odd sensing circuits and the output signals OUT1_E, OUT2_E, OUT3_E, and OUT4_E provided by the even sensing circuits.

As will be appreciated by those skilled in the art, each of the first and second parallel/serial converters PS1 and PS2 may implemented using an arrangement of one or more shift register(s). Selection circuit 118 may implemented using a multiplexer MUX.

As shown in FIG. 5, the anti-fuse circuit 110a may further comprise a serial/parallel converter SP1 configured to convert the serial output signal provided by the selection circuit 118 into parallel output signals OUT1, OUT2, OUT3, and OUT4.

Figure 6:
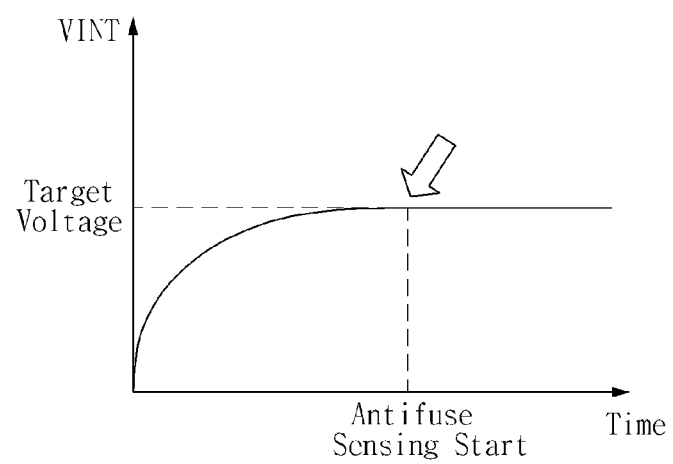
FIGS. 6 and 7 are timing diagrams illustrating one possible operation of the anti-fuse circuit of FIG. 1 and another possible operation of the anti-fuse circuit of FIG. 1 as applied to sensing operation.
Figure 7:
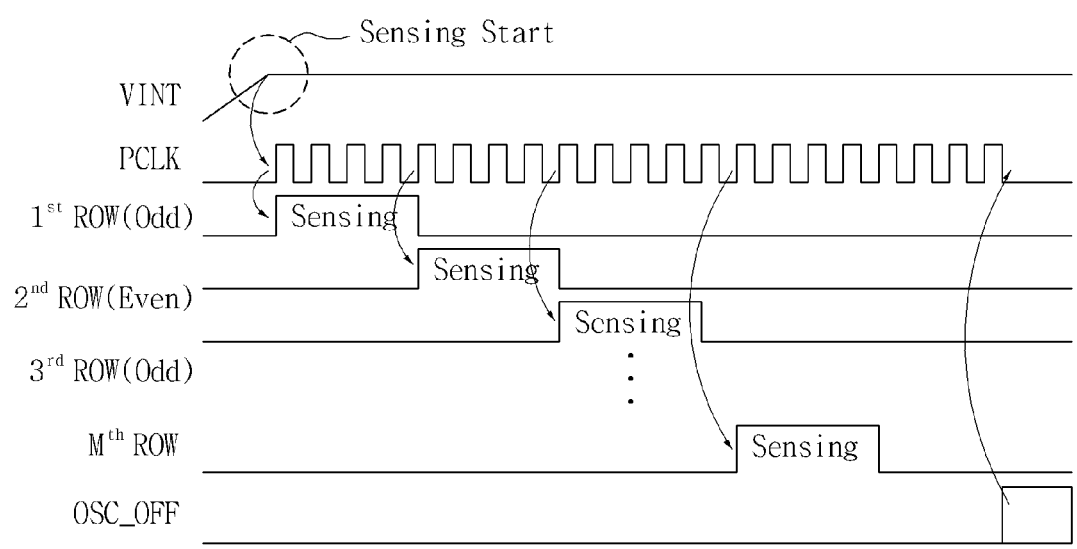

FIGS. 6 and 7 are timing diagrams illustrating one possible operation of the anti-fuse circuit 110 of FIG. 1.

Referring to FIG. 6, the anti-fuse circuit 110 may sense the state of an internal power supply voltage VINT apparent within the constituent semiconductor memory device during a power-up operation for the semiconductor memory device. Once the internal power supply voltage VINT reaches a target voltage level, a read operation may be performed on the array of anti-fuse elements provided by the anti-fuse circuit 111.

Referring to FIG. 7, after the internal power supply voltage VINT of the semiconductor memory device reaches the target voltage level, a sensing operation for the read operation of the anti-fuse array is begun. When the internal power supply voltage VINT reaches the target level, a clock signal PCLK may be generated, and an odd word line may be enabled so that a first row, which is an odd row, may perform a sensing operation. The next even word line may be enabled so that a second row, which is an even row, may perform a sensing operation. The next odd word line may be enabled so that a third row, which is an odd row, may perform a sensing operation. When all the rows finish the sensing operation, the clock signal PCLK may stop oscillating in response to an oscillation termination signal OSC_OFF in order to prevent application of an unnecessary test mode or fluctuation in a direct-current (DC) voltage during transmission of data.

Figure 8:
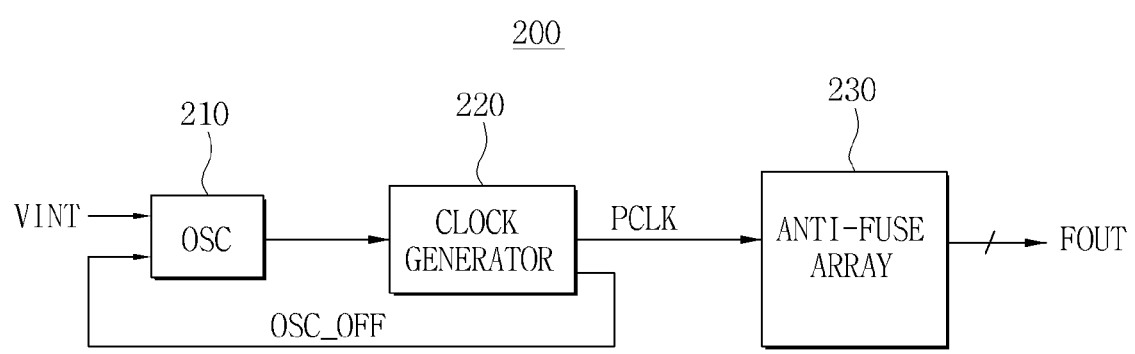
FIG. 8 is a block diagram of a circuit configured to generate a clock signal used by the anti-fuse circuit of FIG. 1.

FIG. 8 is a block diagram of a clock signal generation circuit that may be used in conjunction with the anti-fuse circuit 110 of FIGS. 1 and 7. Referring to FIG. 8, a clock signal generation circuit 200 comprises an oscillator 210 and a clock generator 220.

The oscillator 210 may be used to generate an oscillating signal in response to the internal power supply voltage VINT and a feedback signal, the oscillation termination signal OSC_OFF. The clock generator 220 may be used to generate the clock signal PCLK based on an output signal of the oscillator 210 and generate the oscillation termination signal OSC_OFF. The anti-fuse array 230 may perform a fusing operation in response to the clock signal PCLK and generate a fuse output signal FOUT.

Figure 9:
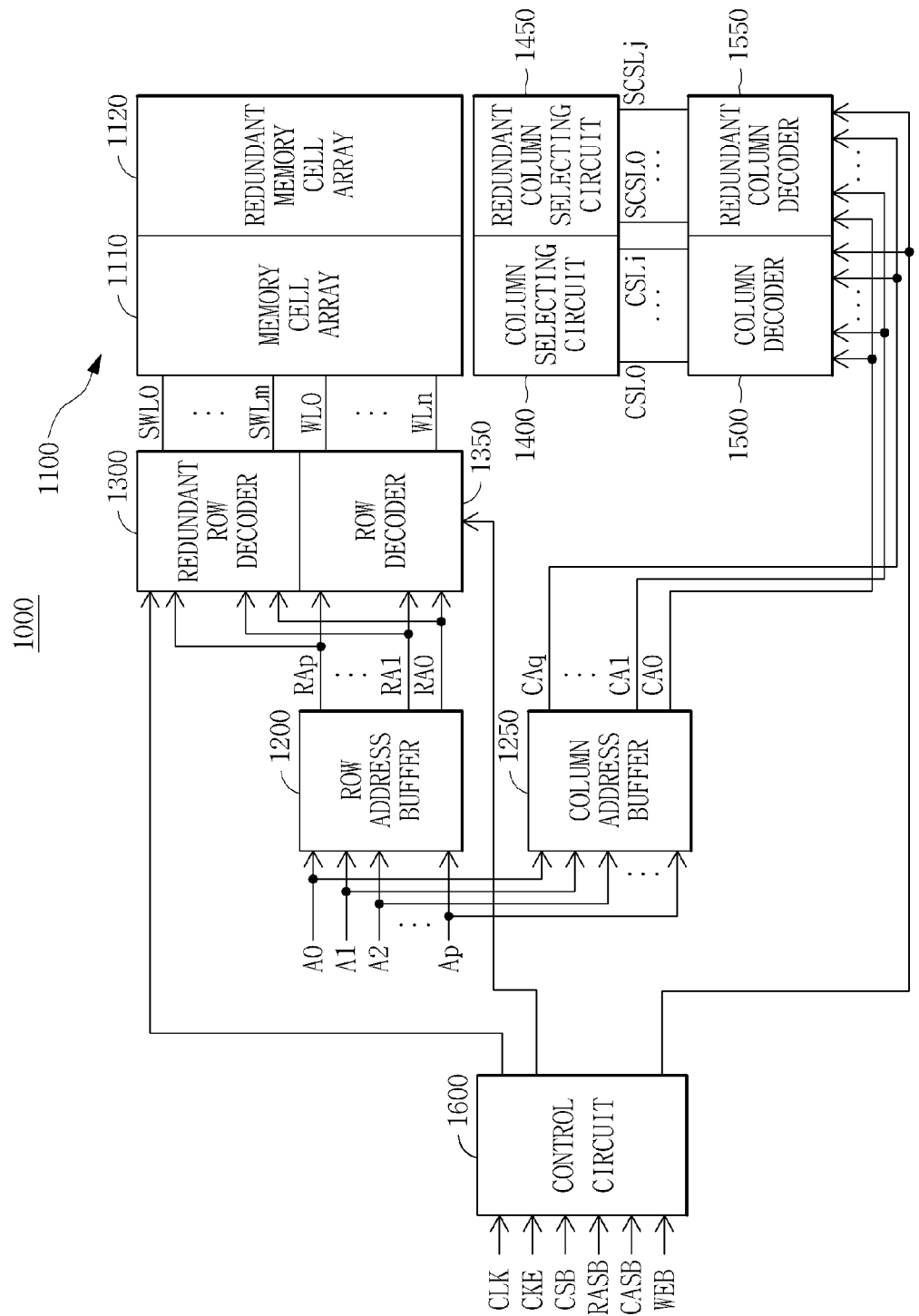
FIG. 9 is a block diagram of a semiconductor memory device including an anti-fuse circuit according to embodiments of the inventive concept.

FIG. 9 is a block diagram of a semiconductor memory device 1000 including an anti-fuse circuit according to embodiments of the inventive concept.

Referring to FIG. 9, the semiconductor memory device 1000 comprises a memory cell array 1100, a row address buffer 1200, a column address buffer 1250, a row decoder 1350, a redundant row decoder 1300, a column decoder 1500, a redundant column decoder 1550, a column selection circuit 1400, and a redundant column selection circuit 1450. Also, the semiconductor memory device 1000 may include a control circuit 1600 configured to generate control signals based on command signals, such as a clock signal CLK, a clock enable signal CKE, a chip selection signal CSB, a row address strobe signal RASB, a column address strobe signal CASB, and a write enable signal WEB and control blocks constituting the semiconductor memory device 1000.

The memory cell array 1100 may include a normal memory cell array 1110 connected to word lines and column selection lines, and a redundant memory cell array 1120 connected to redundant word lines and redundant column selection lines. The row address buffer 1200 may buffer address signals A0, A1, . . . , and Ap, and generate row address signals RA0, RA1, . . . , and RAp. The column address buffer 1250 may buffer the address signals A0, A1, . . . , and Ap, and generate column address signals CA0, CA1, . . . , and CAq.

The row decoder 1350 may decode the row address signals RA0, RA1, . . . , and Rap, generate redundant word line driving signals SWL0, . . . , and SWLm, and transmit the redundant word line driving signals SWL0, . . . , and SWLm to the redundant word lines.

The column decoder 1500 may decode the column address signals CA0, CA1, . . . , and CAq, generate column selection signals CSL0, . . . , and CSLi, and transmit the column selection signals CSL0, . . . , and CSLi to the column selection lines. When a defects occurs in at least one of the column selection lines, the redundant column decoder 1550 may decode the column address signals CA0, CA1, . . . , and CAq, generate redundant column selection signals SCSL0, . . . , and SCSLj, and transmit the redundant column selection signals SCSL0, . . . , and SCSLj to the redundant column selection lines.

The column selection circuit 1400 may amplify the column selection signals CSL0, . . . , and CSLi, and control input/output (I/O) operations of data to and from the normal memory cell array 1110. The redundant column selection circuit 1450 may amplify the redundant column selection signals SCSL0, . . . , and SCSLj, and control I/O operations of data to and from the redundant memory cell array 1120.

The redundant row decoder 1300 and/or the redundant column decoder 1550 may include an anti-fuse circuit according to embodiments of the inventive concept. The anti-fuse circuit included in the redundant row decoder 1300 and/or the redundant column decoder 1550 of the semiconductor memory device 1000 may include a plurality of TMR elements and a plurality of transistors connected in series to the TMR elements, respectively, break down MTJs of at least one of the TMR elements, and store fuse information. Accordingly, when the normal memory cell array 1110 includes a defective cell, the semiconductor memory device 1000 may safely replace the defective cell with a redundant memory cell.

Although FIG. 9 illustrates the semiconductor memory device including both the redundant row decoder 1300 and the redundant column decoder 1550, the semiconductor memory device may include any one of the redundant row decoder 1300 and the redundant column decoder 1550.

Figure 10:
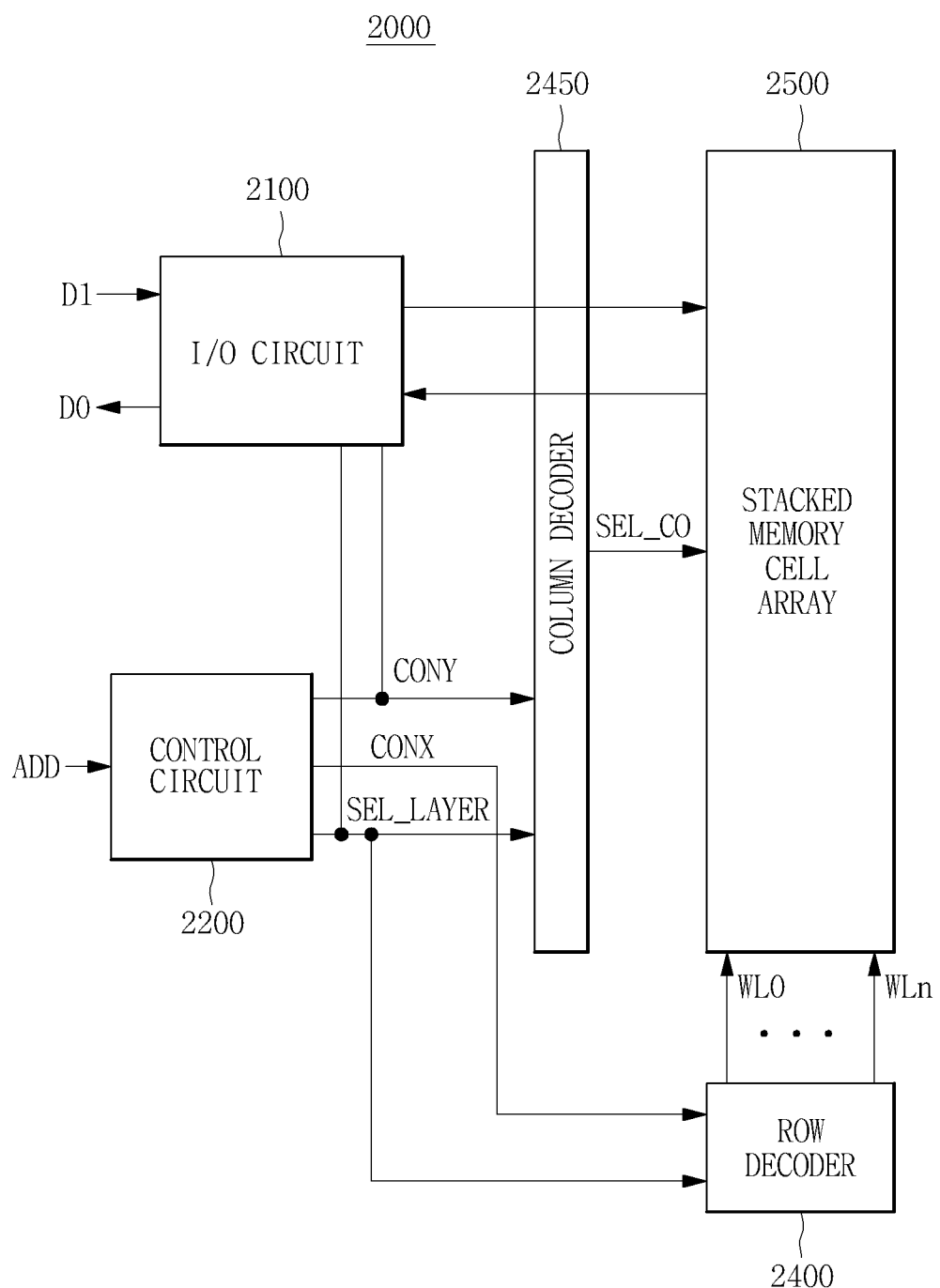
FIG. 10 is a block diagram of a stacked semiconductor memory device including an anti-fuse circuit according to embodiments of the inventive concept.

FIG. 10 is a block diagram of a stacked semiconductor memory device 2000 including an anti-fuse circuit according to embodiments of the inventive concept. The semiconductor memory device of FIG. 10 may be an MRAM.

Referring to FIG. 10, the stacked semiconductor memory device 2000 may include an I/O circuit 2100, a control circuit 2200, a row decoder 2400, a column decoder 2450, and a stacked memory cell array 2500.

The control circuit 2200 may set program modes of memory cell array layers based on an address signal ADD and program information, control timing and voltage level of the address signal ADD to generate a row control signal CONX and a column control signal CONY, and generate a layer selection signal SEL_LAYER based on the row control signal CONX and the column control signal CONY.

The row decoder 2400 may decode the row control signal CONX and the layer selection signal SEL_LAYER, generate word line driving signals WL0 to WLn, and transmit the word line driving signals WL0 to WLn to the stacked memory cell array 2500. The column decoder 2450 may decode the column control signal CONY and the layer selection signal SEL_LAYER, generate a column selection signal SEL_CO, and transmit the column selection signal SEL_CO to the stacked memory cell array 2500. The I/O circuit 2100 may include a sense amplifier and a write driving circuit, and transmit input data DI to the stacked memory cell array 2500 in response to the column control signal CONY and the layer selection signal SEL_LAYER in a write operation mode. Also, the I/O circuit 2100 may sense and amplify a voltage of a bit line in response to the column control signal CONY and the layer selection signal SEL_LAYER, and generate output data DO in a read operation mode.

In the stacked semiconductor memory device 2000 shown in FIG. 10, the row decoder 2400 and/or the column decoder 2450 may include an anti-fuse circuit according to embodiments of the inventive concept. The anti-fuse circuit included in the row decoder 2400 and/or the column decoder 2450 of the stacked semiconductor memory device 2000 may include a plurality of TMR elements and a plurality of transistors connected in series to the TMR elements, respectively, break down MTJs of at least one of the TMR elements, and store fuse information. Accordingly, when a normal memory cell array includes a defective cell, the stacked semiconductor memory device 2000 may safely replace the defective cell with a redundant memory cell.

In FIG. 10, the stacked memory cell array 2500 may be formed within memory cell array layers, and the I/O circuit 2100, the control circuit 2200, the row decoder 2400, and the column decoder 2450 may be formed within a semiconductor substrate.

Figure 11:
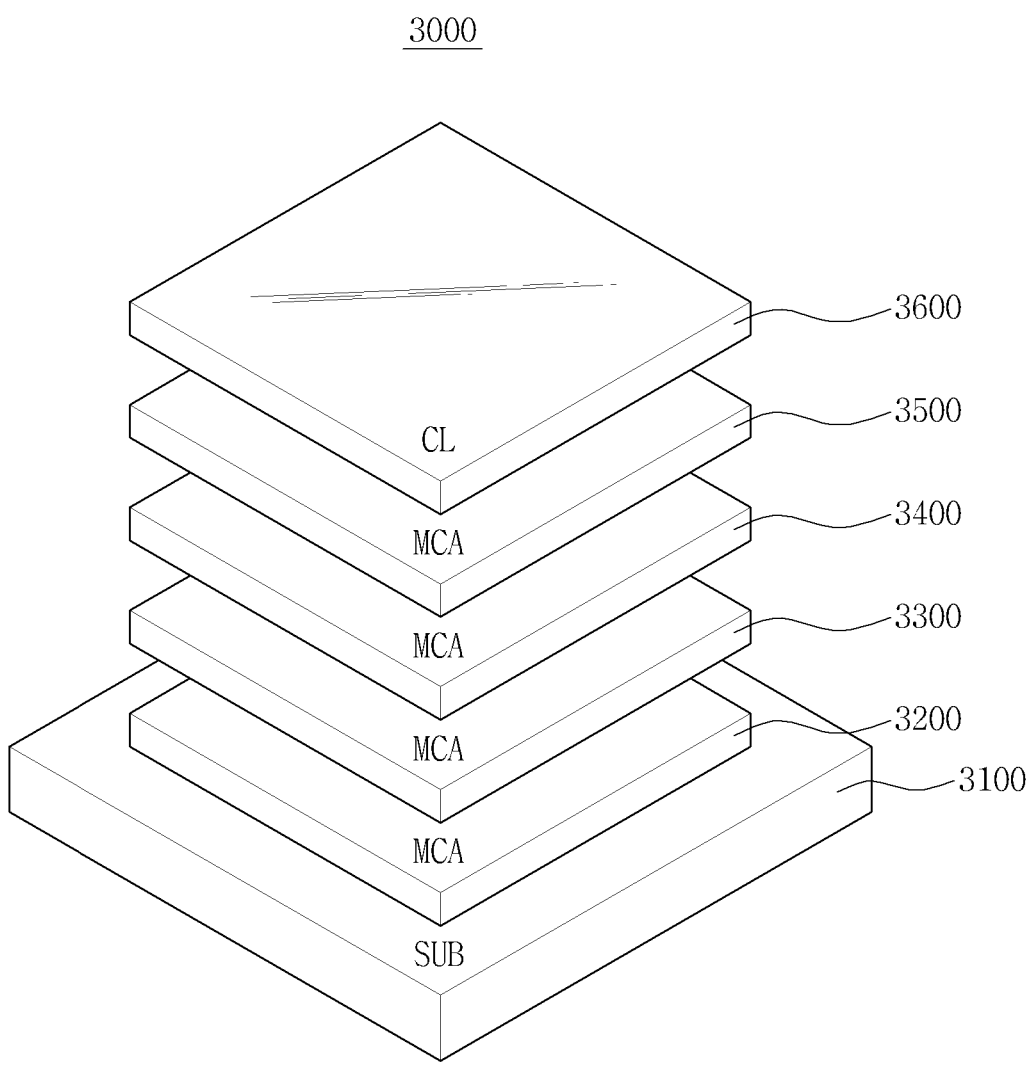
FIG. 11 is a perspective view of a 3-dimensional structure of the stacked semiconductor memory device of FIG. 10.

FIG. 11 is a perspective view of a 3-dimensional (3D) structure of the stacked semiconductor memory device of FIG. 10.

Referring to FIG. 11, a semiconductor memory device 3000 may include a semiconductor substrate 3100, memory cell array layers 3200, 3300, 3400, and 3500, and a connection layer 3600.

The semiconductor substrate 3100 may include functional circuits, such as the I/O circuit 2100, the control circuit 2200, the row decoder 2400, and the column decoder 2450 shown in FIG. 10. The memory cell array layers 3200, 3300, 3400, and 3500 may be stacked on the semiconductor substrate 3100. The connection layer 3600 may be stacked over the semiconductor substrate 3100 independent of the memory cell array layers 3200, 3300, 3400, and 3500, and electrically connect memory cell selection lines arranged in the memory cell array layers 3200, 3300, 3400, and 3500 with the functional circuits included in the semiconductor substrate 3100.

Figure 12:
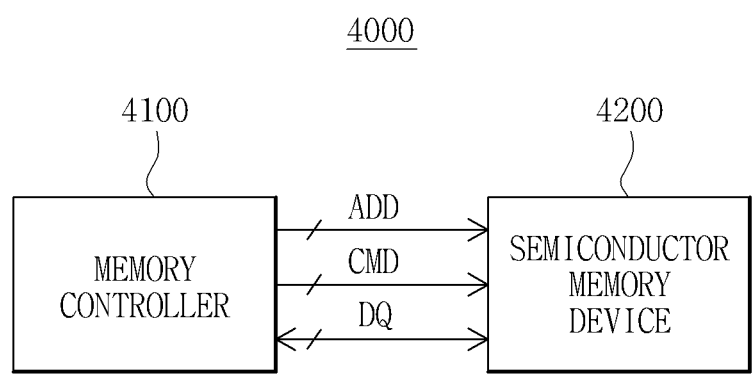
FIG. 12 is a block diagram of a memory system including an anti-fuse circuit according to embodiments of the inventive concept.

FIG. 12 is a block diagram of a memory system 4000 including an anti-fuse circuit according to embodiments of the inventive concept.

Referring to FIG. 12, the memory system 400 may include a memory controller 4100 and a semiconductor memory device 4200.

The memory controller 4100 may generate an address signal ADD and a command CMD, and transmit the address signal ADD and the command CMD to the semiconductor memory device 4200 through buses. Data DQ may be transmitted from the memory controller 4100 to the semiconductor memory device 4200, or transmitted from the semiconductor memory device 4200 to the memory controller 4100 through the buses.

The semiconductor memory device 4200 may include an anti-fuse circuit used to replace a portion of a normal memory array in the semiconductor memory device 4200 with a redundant memory cell array (or portion thereof) in response to certain conditions. The anti-fuse circuit may include a plurality of TMR elements and a plurality of transistors connected in series to the TMR elements, respectively, break down MTJs of at least one of the TMR elements, and store fuse information. Accordingly, when the normal memory cell array includes one or more defective cell(s), the stacked semiconductor memory device 4000 may safely replace the defective cell with a redundant memory cell.

An anti-fuse circuit according to embodiments of the inventive concept can breakdown MTJs of at least one of TMR elements, and store fuse information. Thus, when a normal memory cell array includes a defective cell, a semiconductor memory device including the anti-fuse circuit can safely replace the defective cell with a redundant memory cell. In particular, an MRAM cell array including downscaled MRAM cells having volatile characteristics can be applied to the anti-fuse circuit. Also, the anti-fuse circuit according to the embodiments of the inventive concept does not need a pumping circuit because a high voltage is not required to break down an MTJ. Furthermore, since the anti-fuse circuit according to the embodiments of the inventive concept uses a small-sized MRAM cell as a fuse, layout size of the anti-fuse circuit can be reduced.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. An anti-fuse circuit comprising:
    an array of anti-fuses, each anti-fuse comprising a tunneling magneto-resistance (TMR) element series connected with a transistor and configured to breakdown a magnetic tunnel junction (MTJ) of the TMR element in response to an applied first voltage, such that alternately provided normal resistance and breakdown resistance for the TMR define an output signal for the anti-fuse that indicates fuse information stored by the anti-fuse; and
    a sensing circuit configured to sense and amplify the respective output signals provided by the anti-fuses.

2. The circuit of claim 1, wherein the TMR element and transistor of each anti-fuse are provided by a magnetic random access memory (MRAM) cell.

3. The circuit of claim 2, wherein the TMR element includes a first terminal connected to a corresponding bit line traversing the array of anti-fuses and a second terminal, and
    the transistor includes a drain connected to the second terminal, a gate connected to a corresponding word line traversing the array of anti-fuses, and a source connected to a source line.

4. The circuit of claim 3, wherein during programming of a selected MRAM cell, the first voltage is applied to a corresponding bit line, a second voltage is applied to a corresponding word line, and a low power supply voltage is applied to the source line.

5. The circuit of claim 4, wherein the TMR element included in the selected MRAM cell is programmed by application of the first voltage to the corresponding bit line.

6. The circuit of claim 4, wherein the first voltage ranges from between about 1V and 2V.

7. The circuit of claim 3, wherein the TMR element comprises:
    a pinned magnetic layer having a predetermined pinned magnetic direction;
    a free magnetic layer configured to be magnetized in the direction of an externally applied magnetic field; and
    a tunnel barrier layer formed of an insulating film between the pinned magnetic layer and the free magnetic layer.

8. The circuit of claim 7, wherein an ON-state and an OFF-state for the anti-fuse are determined in accordance with whether or not a breakdown of the tunnel barrier layer has occurred.

* * * * *